United States Patent [19]

Watanabe

[11] Patent Number: 5,028,823
[45] Date of Patent: Jul. 2, 1991

[54] DELAY DEVICE WITH INTERMITTENT CAPACITOR DISCHARGE

[75] Inventor: Hirofumi Watanabe, Himeji, Japan

[73] Assignee: Mitsubishi Denki Kabushiki Kaisha, Tokyo, Japan

[21] Appl. No.: 372,964

[22] Filed: Jun. 29, 1989

[30] Foreign Application Priority Data

Aug. 6, 1988 [JP] Japan .................. 63-104313

[51] Int. Cl.$^5$ .......................................... H03K 5/159
[52] U.S. Cl. ..................... 307/590; 307/597; 307/603; 307/605; 307/246; 328/55
[58] Field of Search ............... 307/590, 597, 603, 605, 307/246; 328/55, 58; 331/17

[56] References Cited

U.S. PATENT DOCUMENTS

| | | | |
|---|---|---|---|
| 4,430,587 | 2/1984 | Tennyson | 307/590 |
| 4,504,749 | 5/1985 | Yoshida | 307/590 |
| 4,626,716 | 12/1986 | Miki | 307/590 |
| 4,680,529 | 7/1987 | Komurasaki et al. | 322/28 |

FOREIGN PATENT DOCUMENTS

| | | |
|---|---|---|
| 1152145 | of 1963 | Fed. Rep. of Germany . |
| 1279810 | of 1968 | Fed. Rep. of Germany . |
| 2146489 | of 1973 | Fed. Rep. of Germany . |
| 2354424 | of 1977 | Fed. Rep. of Germany . |
| 19223 | of 1981 | Japan . |
| 103422 | of 1984 | Japan . |

Primary Examiner—Stanley D. Miller
Assistant Examiner—Trong Phan
Attorney, Agent, or Firm—Sughrue, Mion, Zinn, Macpeak and Seas

[57] ABSTRACT

A delay device has an oscillation circuit 1, a transistor 201 turned on and off by a signal from the oscillation circuit; and a delay circuit comprising a capacitor 203 and a resistor 202 connected to the transistor so that the delay circuit is intermittently controlled by the on-off operations of the transistor.

3 Claims, 2 Drawing Sheets

DELAY DEVICE WITH INTERMITTENT CAPACITOR DISCHARGE

BACKGROUND OF THE INVENTION

The present invention relates to a delay device having a time constant delay circuit comprising a capacitor and a resistor.

FIG. 4 is an example of a conventional delay device. In FIG. 4, a reference numeral 2 designates a delay circuit comprising a capacitor 203 and a resistor 202 in which an electric charge in the capacitor 203 is discharged through the resistor 202 to thereby output a delay signal e. A reference voltage circuit 5 is connected to the collector of a transistor 3. When the level of an input signal a becomes "0", the transistor 3 becomes non-conductive state to open the ground circuit, whereby the capacitor 203 is charged by the reference voltage circuit 5 through a diode 4. Namely, when the input signal a is at a level of "0", the transistor 3 becomes non-conductive, and the capacitor 203 is quickly charged to a predetermined level by the reference voltage circuit 5 through the diode 4. When the level of the input signal a is changed to level of "1", the transistor 3 is turned on so that the reference voltage circuit 5 is grounded. Then, a charging circuit to the capacitor 203 is opened, and at the same time, the capacitor 203 starts discharging through the resistor 202. A discharging time is determined by the product of the capacitance c of the capacitor 203 and the resistance R of the resistor 202, i.e. a time constant of CR. Thus, a signal indicated by a in FIG. 3 is obtainable as a delay signal e.

In the conventional CR delay device having the construction as above-mentioned, when a long delay time is to be obtained, it is necessary to increase the CR constant. When the CR delay device is installed in a hybrid IC, it is difficult to use a resistor having a large resistance because of a problem of leakage. Further, a capacitor having a large capacitance, hence having a relatively large outer configuration occupies a larger area on the base substrate for a hybrid IC. On the other hand, there is a demand to increase the packing density in the field of hybrid IC. A delay device having a long delay time constructed by the conventional technique reduces the efficiency in such hybrid IC.

SUMMARY OF THE INVENTION

It is an object of the present invention to provide a delay device capable of increasing the packing density without using a capacitor and/or a resistor having a larger capacitance or a resistance and capable of increasing a delay time.

In accordance with the present invention, there is provided a delay device having a delay circuit comprising a capacitor and a resistor, characterized by an oscillation circuit, a transistor turned on and off by a signal from said oscillation circuit, and said delay circuit of the capacitor and the resistor connected to said transistor so that the delay circuit is intermittently controlled by the on-off operations of said transistor.

DETAILED DESCRIPTION OF THE PREFERRED EMBODIMENT

Figure 1:
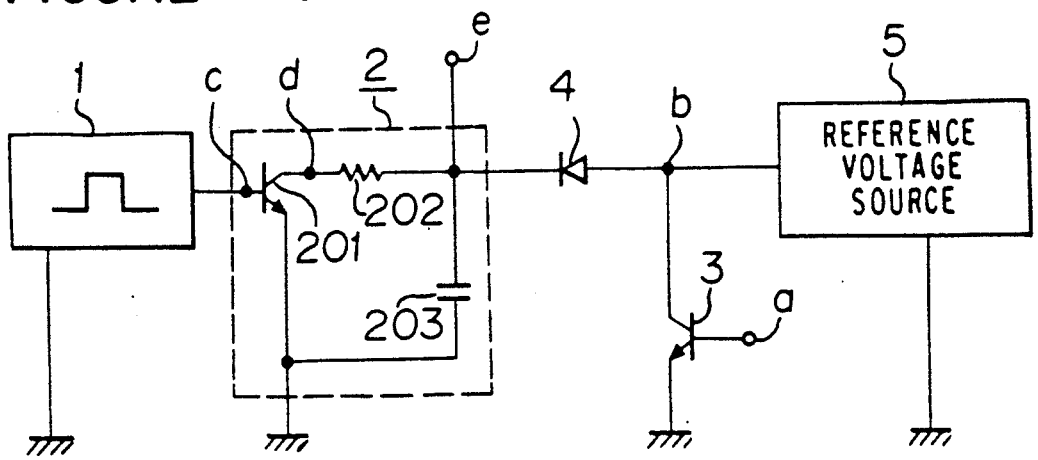
FIG. 1 is a circuit diagram showing an embodiment of the delay device according to the present invention.

A preferred embodiment of the delay device according to the present invention will be described with reference to the drawings. In FIG. 1, a reference numeral 1 designates an oscillation circuit and a numeral 2 designates a delay circuit which is subjected to an intermittent-discharge control. Namely, an electric charge in a capacitor 203 is discharged through a resistor 202 by a transistor 201 which is turned on and off by the signal of the oscillation circuit 1. The capacitor 203 is connected to a reference voltage circuit 5 through a diode 4. The collector of a transistor 3 is connected to the junction between the reference voltage circuit 5 and the diode 4. The emitter of the transistor 3 is grounded and the base of the transistor 3 is supplied with an input signal a. When the level of the input signal a is changed to "0", the transistor 3 is cut off and the capacitor 203 is charged through the diode 4 by the reference voltage circuit 5 connected to the collector of the transistor 3.

The discharge circuit of a serial connection of the capacitor 203 and the resistor 202 is connected across the collector/emitter of the transistor 201.

The operation of the above-mentioned embodiment will be described.

When the level of the input signal a is "0", the transistor 3 is in a non conductive state, whereby the capacitor 203 is quickly charged to a predetermined level by the reference voltage circuit 5 through the diode 4. In this case, the transistor 201 is turned on and off with a predetermined period and duty by the output signal of the oscillation circuit 1 as shown in FIG. 2c. Accordingly, the discharge circuit comprising the capacitor 203 and the resistor 202 is controlled to be opened and closed. The resistance of the resistor 202 is so determined as to be sufficiently larger than the resistance in the reference voltage circuit so that the level of the charged capacitor does not substantially change when the discharge circuit is closed.

Figure 3:
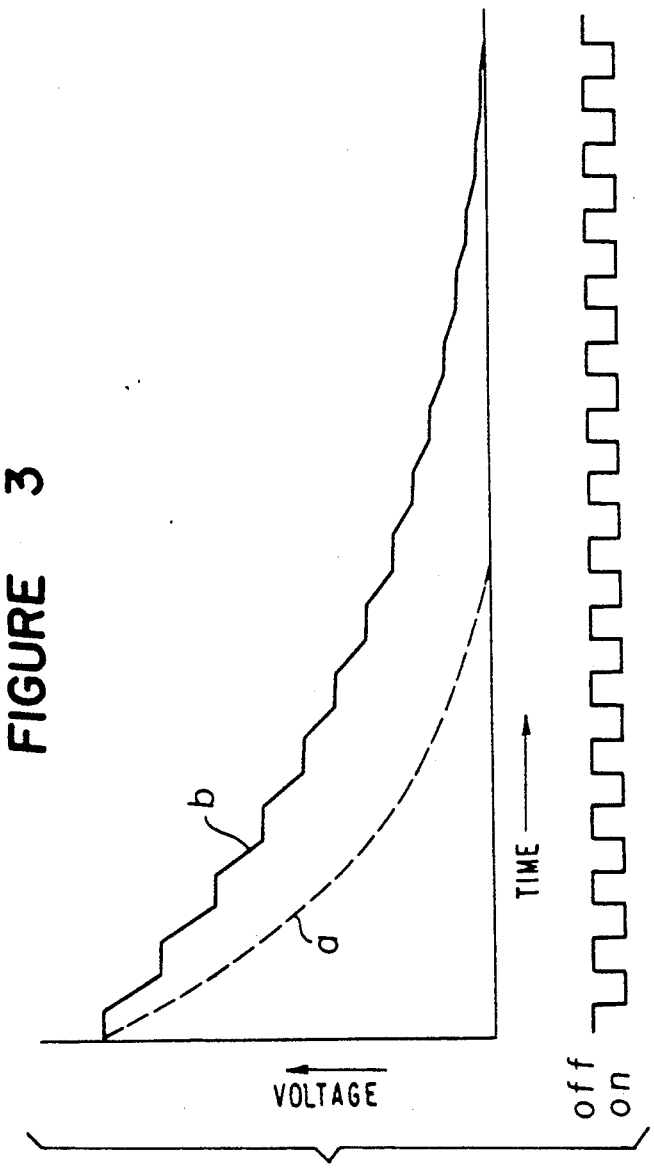
FIG. 3 is a diagram showing delay signal characteristic and a waveform for intermittent control.
Figure 4:
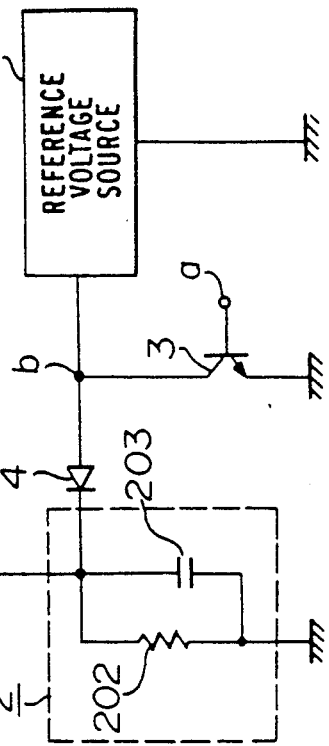
FIG. 4 is a circuit diagram of a conventional delay device.

When the level of the input signal a is changed to "1", the transistor 3 becomes conductive, so that the reference voltage circuit is connected to ground. Then, the discharge circuit to the capacitor 203 is opened and the capacitor initiates discharging. However, since the electric charge in the capacitor 203 is discharged through the transistor 201, the discharging is allowed only when the transistor 201 is in a conductive state. Accordingly, a delay signal e having a discharge time linger than the CR constant can be obtained by determining a period of oscillation of the oscillation circuit 1 to be a suitable period shorter than the CR constant. For instance, when the duty is 50%, the discharge time is doubled (i.e. 1/0.5×2). The delay signal e obtained by the duty of 50% is shown by curve b in FIG. 3. The frequency of the oscillated signal determines the resolution of the intermittent discharging (stepwise discharging), and when the resolution is large, a smooth discharge waveform can be obtained.

Figure 2:
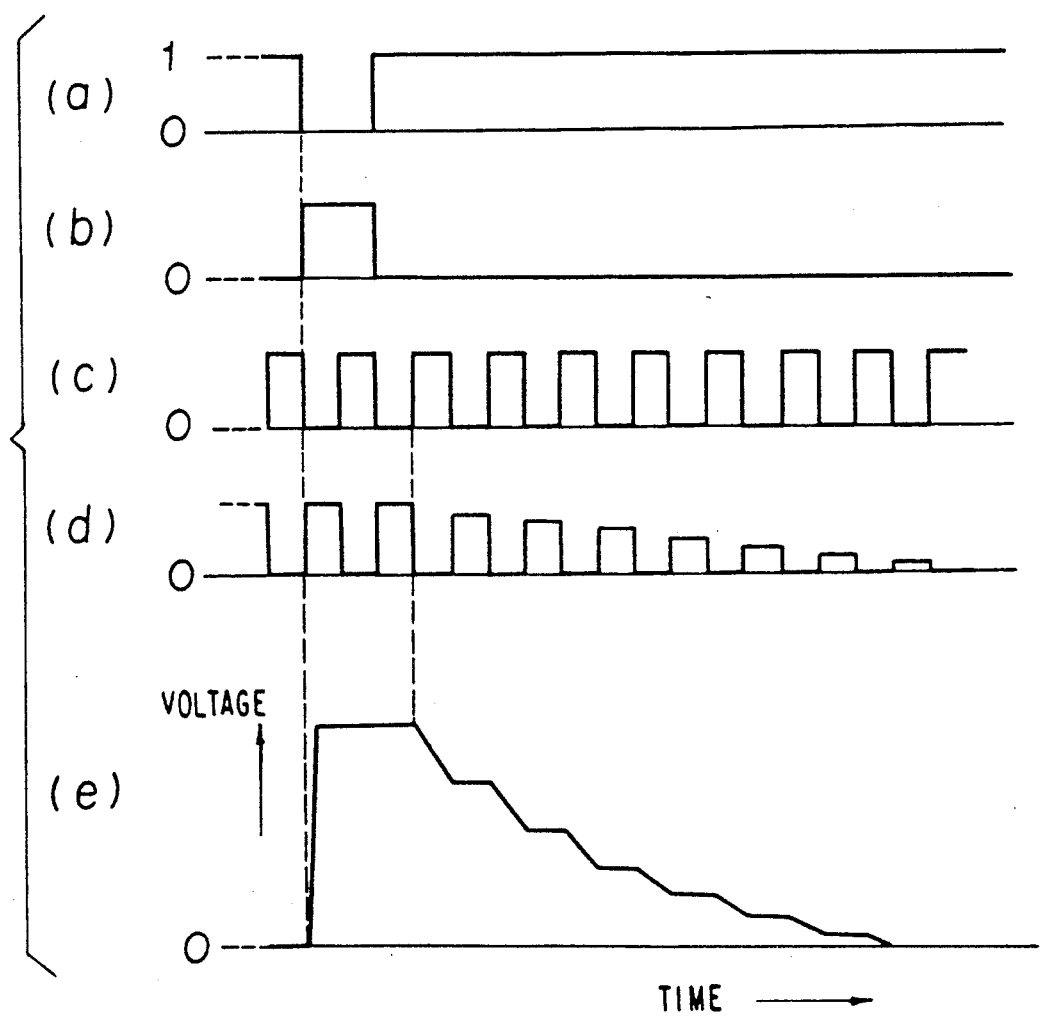
FIGS. 2(a)–2(e) is a time chart of the delay device as in FIG. 1.

FIG. 2 is a time chart showing signals at connecting points a, b, c, d, and e in FIG. 1.

In the above mentioned embodiment, the function of delaying the discharge can be obtained by intermittently controlling the discharging. It goes without saying that the function of delaying electric charging is obtainable by intermittently controlling the charging.

Thus, in accordance with the present invention, the delay circuit of the resistor and the capacitor is intermittently controlled by the transistor. Accordingly a large time constant of discharging or charging can be obtained with a small CR constant and a delay device having a high packing density is obtainable.

I claim:

1. A delay device comprising:
   a) a reference voltage source (5),
   b) switch means (3) for selectively grounding an output of the reference voltage source,
   c) a capacitor (203) having a first terminal grounded and a second terminal coupled to said output of the reference voltage source for charging thereby when the switch means is off,
   d) a series circuit including a resistor (202) and a collector-emitter path of a transistor (201) connected in parallel with the capacitor to define an RC time constant circuit, and
   e) an oscillator (1) having an output coupled to a base terminal of the transistor for supplying a pulse train thereto,
   f) wherein the capacitor, when charged, discharges intermittently through the resistor and transistor path in accordance with the conduction of the transistor as controlled by the pulse train output of the oscillator, such that a stepped decay voltage is produced at said second terminal of the capacitor.

2. A delay device as claimed in claim 1, wherein the switch means comprises a further transistor having a collector-emitter path connected between said output of the reference voltage source and ground, and a base terminal adapted to receive a control signal.

3. A delay device as claimed in claim 2, wherein said second terminal of the capacitor is coupled to said output of the reference voltage source through a diode, such that the capacitor is charged only by a current from the reference voltage source.

* * * * *